(12) United States Patent
Kuzmenka et al.

(10) Patent No.: US 11,949,419 B2
(45) Date of Patent: *Apr. 2, 2024

(54) DELAY ADJUSTMENT CIRCUITS

(71) Applicant: Micron Technology, Inc., Boise, ID (US)

(72) Inventors: Maksim Kuzmenka, Munich (DE); Elena Cabrera Bernal, Munich (DE)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/084,172

(22) Filed: Dec. 19, 2022

(65) Prior Publication Data

US 2023/0119349 A1 Apr. 20, 2023

Related U.S. Application Data

(63) Continuation of application No. 17/351,421, filed on Jun. 18, 2021, now Pat. No. 11,563,427.

(51) Int. Cl.
| | |
|---|---|
| *H03K 5/13* | (2014.01) |
| *G11C 11/22* | (2006.01) |
| *G11C 11/4076* | (2006.01) |
| *H03F 3/45* | (2006.01) |
| *H03G 3/30* | (2006.01) |
| *H03K 5/00* | (2006.01) |

(52) U.S. Cl.
CPC ............ *H03K 5/13* (2013.01); *G11C 11/2293* (2013.01); *G11C 11/4076* (2013.01); *H03F 3/45179* (2013.01); *H03G 3/30* (2013.01); *G11C 11/221* (2013.01); *H03K 2005/00019* (2013.01); *H03K 2005/00208* (2013.01)

(58) Field of Classification Search
CPC ........... H03K 5/13; H03K 2005/00019; H03K 2005/00208; G11C 11/2293; G11C 11/4076; G11C 11/221; H03F 3/45179; H03G 3/30
USPC ......................................................... 327/280
See application file for complete search history.

(56) References Cited

U.S. PATENT DOCUMENTS

| | | | | |
|---|---|---|---|---|
| 4,001,698 | A * | 1/1977 | Allred ...................... | H03K 5/13 327/280 |
| 5,138,204 | A * | 8/1992 | Imamura .................. | H03K 5/13 327/263 |
| 5,890,058 | A * | 3/1999 | Ueno ...................... | H03H 11/04 330/109 |

(Continued)

*Primary Examiner* — Ryan Jager
(74) *Attorney, Agent, or Firm* — Holland & Hart LLP

(57) ABSTRACT

Methods, systems, and devices for delay adjustment circuits are described. Amplifiers (e.g., differential amplifiers) may act like variable capacitors (e.g., due to the Miller-effect) to control delays of signals between buffer (e.g., re-driver) stages. The gains of the amplifiers may be adjusted by adjusting the currents through the amplifiers, which may change the apparent capacitances seen by the signal line (due to the Miller-effect). The capacitance of each amplifier may be the intrinsic capacitance of input transistors that make up the amplifier, or may be a discrete capacitor. In some examples, two differential stages may be inserted on a four-phase clocking system (e.g., one on 0 and 180 phases, the other on 90 and 270 phases), and may be controlled differentially to control phase-to-phase delay.

20 Claims, 11 Drawing Sheets

(56) References Cited

U.S. PATENT DOCUMENTS

| | | | | |
|---|---|---|---|---|
| 6,637,008 | B1* | 10/2003 | Higuchi | H03H 7/20 |
| | | | | 716/132 |
| 8,144,045 | B2* | 3/2012 | Nagata | G01R 31/31922 |
| | | | | 341/152 |
| 10,176,282 | B2* | 1/2019 | Xu | G06F 30/367 |
| 10,313,165 | B2* | 6/2019 | Cheng | H03G 5/28 |
| 11,563,427 | B2* | 1/2023 | Kuzmenka | G11C 11/4076 |
| 2004/0189363 | A1* | 9/2004 | Takano | H03K 5/151 |
| | | | | 327/175 |
| 2004/0219898 | A1* | 11/2004 | Bult | H03G 3/30 |
| | | | | 455/252.1 |
| 2012/0001785 | A1* | 1/2012 | Nagata | H03K 5/2472 |
| | | | | 341/152 |
| 2014/0072025 | A1* | 3/2014 | Matsudaira | H04B 5/0075 |
| | | | | 375/232 |
| 2015/0263812 | A1* | 9/2015 | Tatsumi | H04B 10/588 |
| | | | | 398/189 |
| 2018/0011125 | A1* | 1/2018 | Oshima | G01P 15/125 |
| 2018/0234270 | A1* | 8/2018 | Kimura | H04L 25/03025 |
| 2018/0262374 | A1* | 9/2018 | Cheng | H03F 3/45201 |
| 2020/0241331 | A1* | 7/2020 | Tatsumi | H03F 3/68 |
| 2022/0216860 | A1* | 7/2022 | Kimura | H03K 5/13 |
| 2022/0407505 | A1* | 12/2022 | Kuzmenka | G11C 7/222 |

* cited by examiner

DELAY ADJUSTMENT CIRCUITS

CROSS REFERENCE

The present Application for Patent is a continuation of U.S. patent application Ser. No. 17/351,421 by Kuzmenka et al., entitled "DELAY ADJUSTMENT CIRCUITS," filed Jun. 18, 2021, assigned to the assignee hereof, and is expressly incorporated by reference in its entirety herein.

FIELD OF TECHNOLOGY

The following relates generally to one or more systems for memory and more specifically to delay adjustment circuits.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Four-phase clocking is used in many memory systems because each phase can run at half the speed of comparable two-phase clocking. Running at these lower speeds can allow a fewer quantity of buffers (e.g., re-drivers) to propagate the clock signals and may therefore be more stable over process, voltage, and temperature variations. However, four-phase clocking can present challenges. For example, some of the phases can become out of sync (e.g., delayed or offset) with respect to the other phases, which can result in timing problems. Mitigating these phase-to-phase offset issues can be difficult.

Apparatuses and methods are presented in which amplifiers (e.g., differential amplifiers) may act like variable capacitors (e.g., due to the Miller-effect) to control delays of signals between buffer (e.g., re-drivers) stages. The gains of the amplifiers may be adjusted by adjusting the currents through the amplifiers, which may change the apparent capacitances seen by the signal line (due to the Miller-effect). The capacitance of each amplifier may be the intrinsic capacitance of input transistors that make up the amplifier, or may be a discrete capacitor. In some examples, two differential stages may be inserted on a four-phase clocking system (e.g., one on 0 and 180 phases, the other on 90 and 270 phases), and may be controlled differentially to control phase-to-phase delay.

Features of the disclosure are initially described in the context of systems and dies as described with reference to FIGS. 1 and 2. Features of the disclosure are described in the context of circuits and timing diagrams as described with reference to FIGS. 3A-7C. These and other features of the disclosure are further illustrated by and described with reference to an apparatus diagram and a flowchart that relate to delay adjustment circuits as described with reference to FIGS. 8 and 9.

Figure 1:
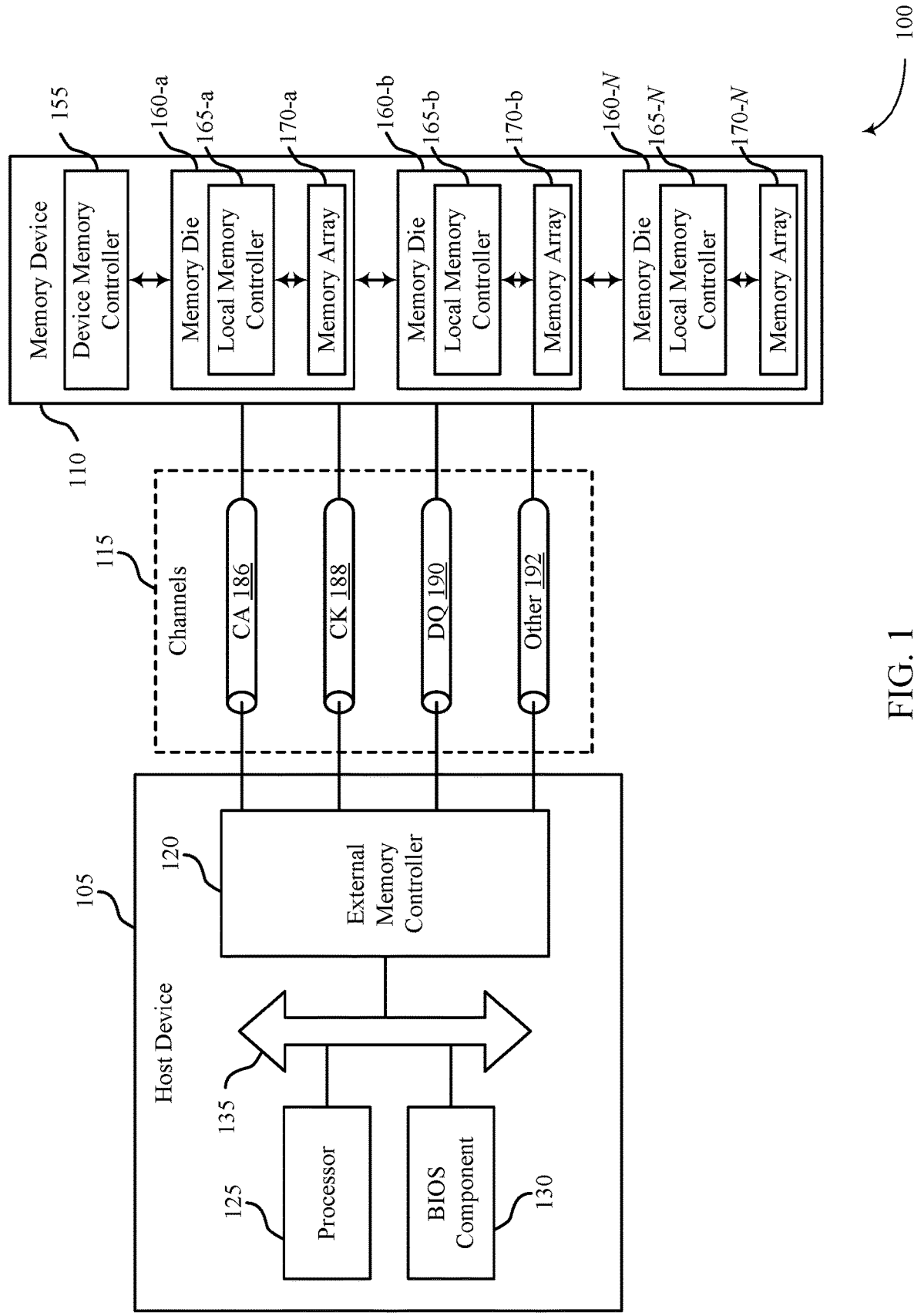
FIG. 1 illustrates an example of a system that supports delay adjustment circuits in accordance with examples as disclosed herein.

FIG. 1 illustrates an example of a system 100 that supports delay adjustment circuits in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The device memory controller 155 or the local memory controller 165 may be used to determine an amount of delay to add to one or more signals and based thereon, to control circuitry that may add the delay to the signals. For example, signals may be input to the controller, the controller may determine an amount of delay to add to one or more of the signals based thereon, and an output of the controller may provide feedback to delay control circuitry.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission media that carry information between the host device 105 and the memory device. Each channel 115 may include one or more signal paths or transmission media (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
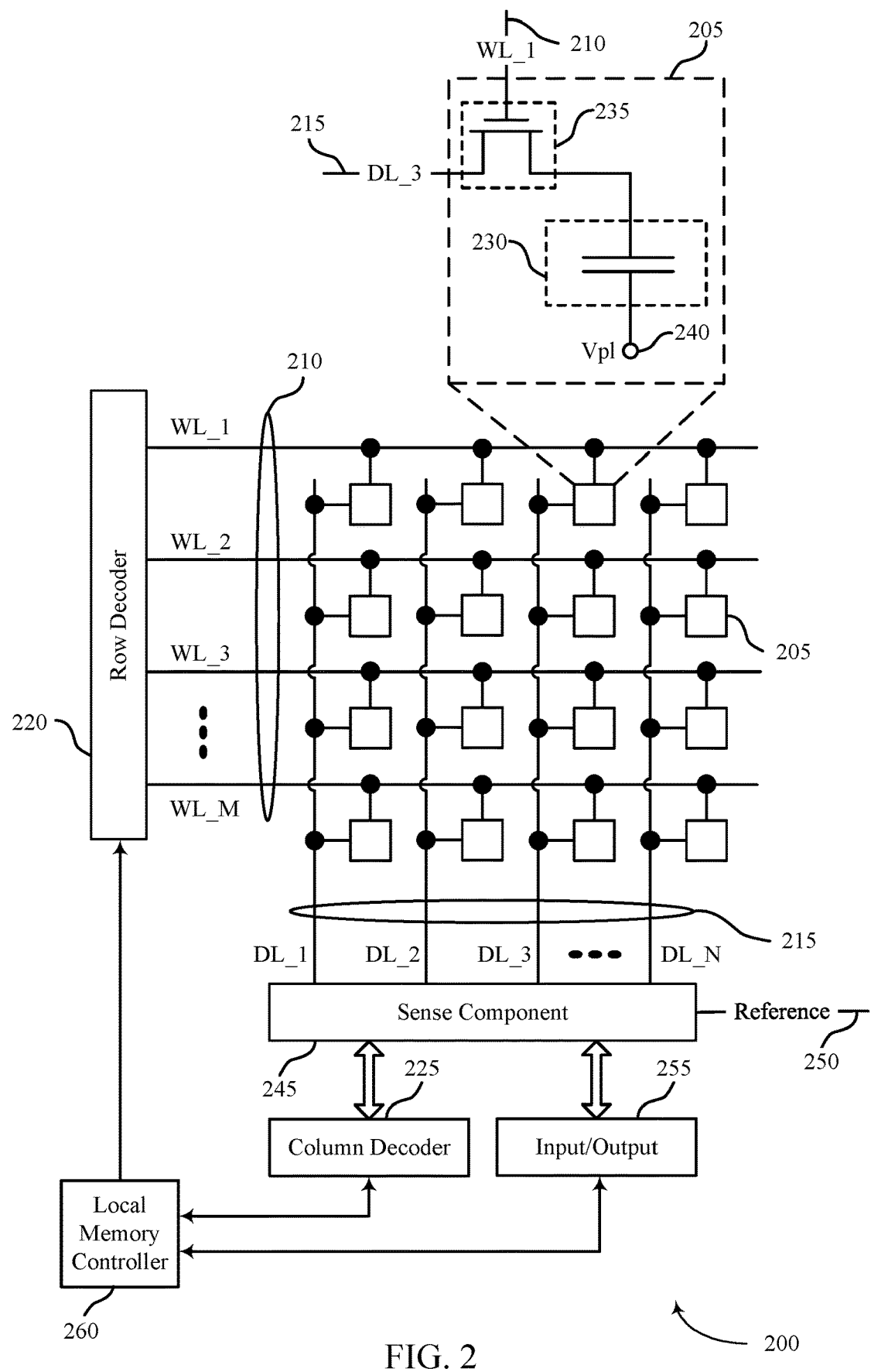
FIG. 2 illustrates an example of a memory die that supports delay adjustment circuits in accordance with examples as disclosed herein.

FIG. 2 illustrates an example of a memory die 200 that supports delay adjustment circuits in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be used to determine an amount of delay to add to one or more signals and based thereon, to control circuitry that may add the delay to the signals. For example, signals may be input to the local memory controller 260, the local memory controller 260 may determine an amount of delay to add to one or more of the signals based thereon, and an output of the local memory controller 260 may provide feedback to delay control circuitry.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

Figure 3A:
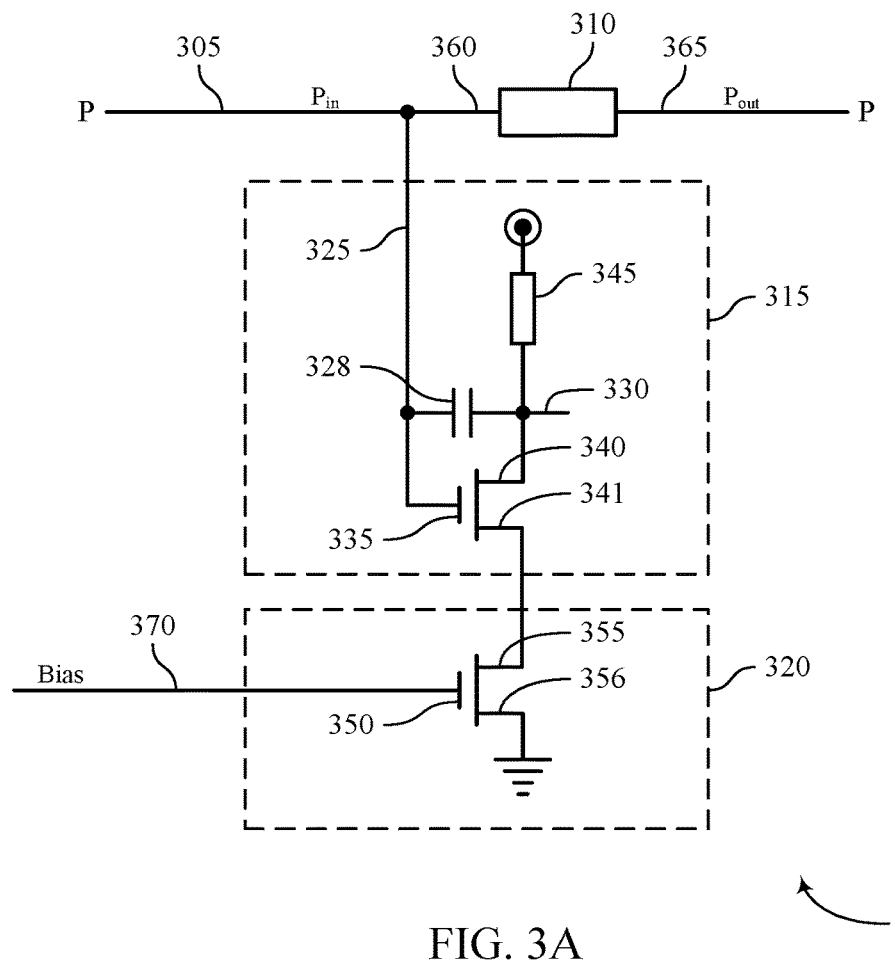
FIGS. 3A-3B illustrate an example of a circuit and associated timing diagram and associated timing diagram that support delay adjustment circuits in accordance with examples as disclosed herein.
Figure 3B:
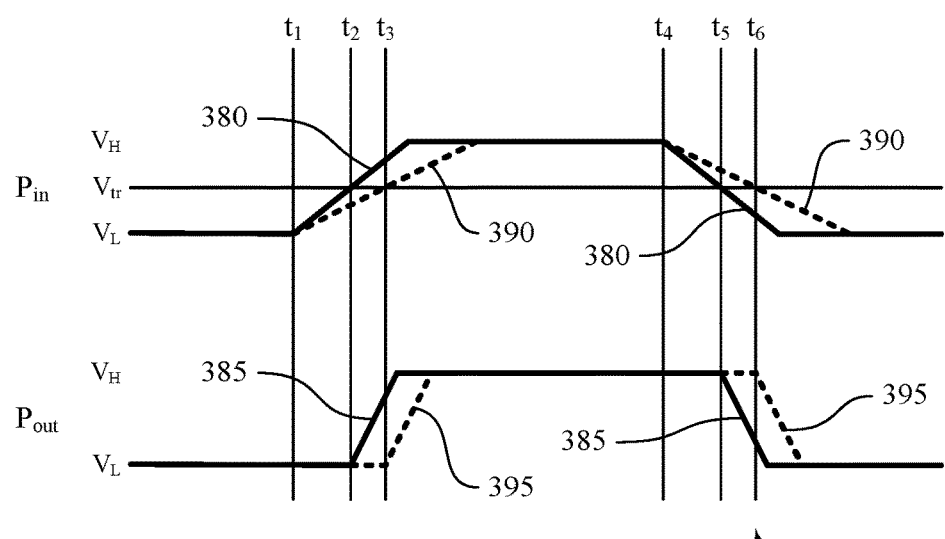

FIGS. 3A and 3B illustrate an example of a circuit 300 and associated timing diagram 301 that support delay adjustment circuits in accordance with examples as disclosed herein. Circuit 300 may be utilized to provide a load on a signal line 305 of a memory device (e.g., memory device 110 as described with reference to FIG. 1) and thereby cause a delay of a signal P (e.g., a clock signal) on a signal line 305 as the signal passes through a buffer 310. In some examples, the circuit 300 may be included on a memory die (e.g., memory die 160 as described with reference to FIG. 1). In other examples, all or a portion of the circuit 300 may be positioned off the memory die. The circuit 300 may include an amplifier 315 and a sub-circuit 320.

An input 325 of the amplifier 315 may be coupled with the signal line 305. The amplifier 315 may have an output node 330 with an impedance between the output node 330 and the input 325. The impedance may include a capacitance 328. The capacitance may be provided by one or more discrete capacitors coupled between the output node 330 and the input 325 or may be an intrinsic capacitance of one or more devices of the amplifier 315 or some combination thereof. The amplifier 315 may have a gain at the output node 330 relative to the input 325. The gain may be a ratio of the power or amplitude of signals produced at the output node 330 to the power or amplitude of the corresponding signals at the input 325.

The amplifier may include an input device (e.g., a transistor 335) coupled with the input 325 of the amplifier 315. The capacitance 328 may include an intrinsic capacitance of the input device. In some examples, the transistor 335 may be a field effect transistor (FET). The gate of the transistor 335 may be coupled to the signal line 305. In some examples, the transistor 335 may be configured in a common-source configuration in which the input 325 of the amplifier is coupled with the gate of the transistor.

A first node 340 (e.g., a drain) of the transistor 335 may be coupled to a voltage source through a load 345 (e.g., resistor). This first node 340 may be the output node of the amplifier. The transistor may include an impedance between the first node 340 and the gate. The impedance of the transistor 335 may include an intrinsic capacitance of the transistor 335 between the first node 340 and the gate. The impedance of the amplifier 315 between the output node 330 and the input 325 may include the impedance of the transistor 335. The gain of the amplifier 315 may include a gain of the transistor 335 between the first node 340 and the gate. The circuit may be configured such that a delay of a signal on the signal line 305 can be controlled by adjusting the gain of the transistor 335.

The sub-circuit 320 may be coupled with the amplifier 315 to control the gain of the amplifier 315. In some cases, the gain of an amplifier (e.g., a transistor) may be dependent on the amount of current that is provided to the amplifier (e.g., a transistor) to pass therethrough. In some examples, the sub-circuit 320 may include a transistor 350 that provides current to the amplifier 315 (e.g., as a current source). In the example of FIG. 3A, the transistor 350 is coupled with the transistor 335 in a current source configuration: a first node 355 (e.g., a drain) of transistor 350 is coupled to a second node 341 (e.g., a source) of the transistor 335 and a second node 356 (e.g., a source) of transistor 350 is coupled to ground. The gate of transistor 350 may receive a bias on a control line 370 that may control the amount of current that flows through the transistor 350 to be provided to the transistor 335 of the amplifier 315. In some examples, the bias may be varied to control the amount of current provided to transistor 335. And by varying the amount of current provided to the transistor 335, the transistor 350 may control the gain of the transistor 335.

The Miller effect is a phenomena of amplifiers (e.g., transistor 335) that accounts for an increase in the equivalent input capacitance (e.g., as "seen" by the signal line 305) of an inverting voltage amplifier that occurs due to amplification of the effect of capacitance between the input and output terminals of the amplifier. The virtually increased input capacitance due to the Miller effect is given by:

$$C_M = C(1+A_v),$$

where $-A_v$ is the voltage gain of the inverting amplifier ($A_v$ positive) and C is the feedback (e.g., intrinsic) capacitance. Since the intrinsic capacitance C remains constant, the capacitance $C_M$ of the amplifier (as seen by the signal line) is directly proportional to the gain $A_v$ of the amplifier. As a result, the capacitance $C_M$ (as seen by the signal line) can be changed or controlled by changing the gain.

With the foregoing in mind, FIG. 3B shows how a bias of transistor 350 may be used to control a delay of a signal P on the signal line 305. The top portion of the diagram (labeled "$P_{in}$") may represent a signal P measured on an input 360 side of the buffer 310 and the bottom portion of the diagram (labeled "$P_{out}$") may represent the signal P measured on an output side 365 of the buffer 310. As such, $P_{in}$ and the $P_{out}$ may depict the signal P before and after propagating through the buffer 310. In the example shown, the signal may move up and down between a low voltage ($V_L$) and a high voltage ($V_H$) The buffer 310 may have a trigger or trip point at a particular value between $V_L$ and $V_H$ (e.g., value $V_{tr}$) that triggers transitioning (e.g., from $V_L$ to $V_H$, or vice versa) of the output.

Two cases in which different bias values, $B_1$ and $B_2$, are applied to transistor 350 via control line 370 are illustrated in FIG. 3B. The different bias values may cause different amounts of current to be provided to the transistor 335, which may result in different respective gains $A_1$ and $A_2$ of the transistor 335. According to the Miller effect, the different gains $A_1$ and $A_2$ may result in different respective capacitances $C_{M(1)}$ and $C_{M(2)}$ of the load (e.g., as seen by the signal line 305), which may affect the slew rate or slope of the signal on signal line 305.

When the bias is $B_1$, the input signal 380 and the output signal 385 may result (the input and output signals 380 and 385 are depicted as solid lines in FIG. 3B). The input signal 380 (and ensuing output signal 385) may initially be at $V_L$, then transition up to $V_H$ and back down to $V_L$ (e.g., as a clock signal). The input signal 380 may transition from $V_L$ to $V_H$ at a general slope S, beginning at a time t1. The slope S may be dependent on the capacitance $C_{M(1)}$. As the input signal 380 rises, it may become equal to $V_{tr}$ at a time t2, which may trigger the buffer 310 to propagate the upward transition, causing the output signal 385 to begin the transition from $V_L$ to $V_H$. The input signal 380 may then transition back from $V_H$ to $V_L$ at the same slope S beginning at a time t4. When the input signal 380 becomes equal to $V_{tr}$ at a time t5, the propagation of the downward transition by buffer 310 may be triggered, causing the output signal 385 to begin the transition from $V_H$ to $V_L$.

When the bias is changed to $B_2$, an input signal 390 and an output signal 395 may result. The input and output signals 390 and 395 are similar to the input and output signals 380 and 385 associated with B1, save for a few exceptions (depicted in dashed lines in FIG. 3B). For example, similar to input signal 380, the input signal 390 may begin transitioning from $V_L$ to $V_H$ at time t1 and from $V_H$ to $V_L$ at time t4, but at a slope S that is less than the slope of the input signal 380, due to the different capacitance $C_{M(2)}$. As a result, the input signal 390 may become equal to $V_{tr}$ at a time t3 that is later than time t2, resulting in the upward transition in the output signal 395 being delayed (with respect to the output signal 385) by a Δt=t3−t2. A similar delay may also occur on the downward transition that begins at time t4, causing the downward transition in the output signal 395 to begin at a delayed time t6, resulting in a same delay Δt. Thus, output signal 395 may be delayed with respect to the output signal 385 by Δt.

One can see that changing the bias or gain of the amplifier may cause the delay to increase or decrease, depending on the value of the bias. In other words, the delay of the signal P may be adjusted by adjusting the value of the bias applied to the transistor 350. So the delay that may occur to a signal P on the signal line 305 as the signal propagates through a buffer 310 may be changed by changing the gain of the amplifier 315, which may be changed by adjusting a current provided to the amplifier 315, which may be changed by changing the bias applied to the transistor 350 acting as a current source to the amplifier 315.

In some examples, circuit 300 may be utilized with a set of related signal lines 305 (e.g., multi-phase clock signal lines). For example, separate circuits 300 may be coupled with respective signal lines 305 and the biases of each circuit 300 may be used to control the delays of the respective signals. In some examples, the control lines 370 of two or more of the circuits 300 may be coupled together to provide a same bias to the respective circuits. This may allow a single bias to be used to control the delay of more than one signal.

Figure 4A:
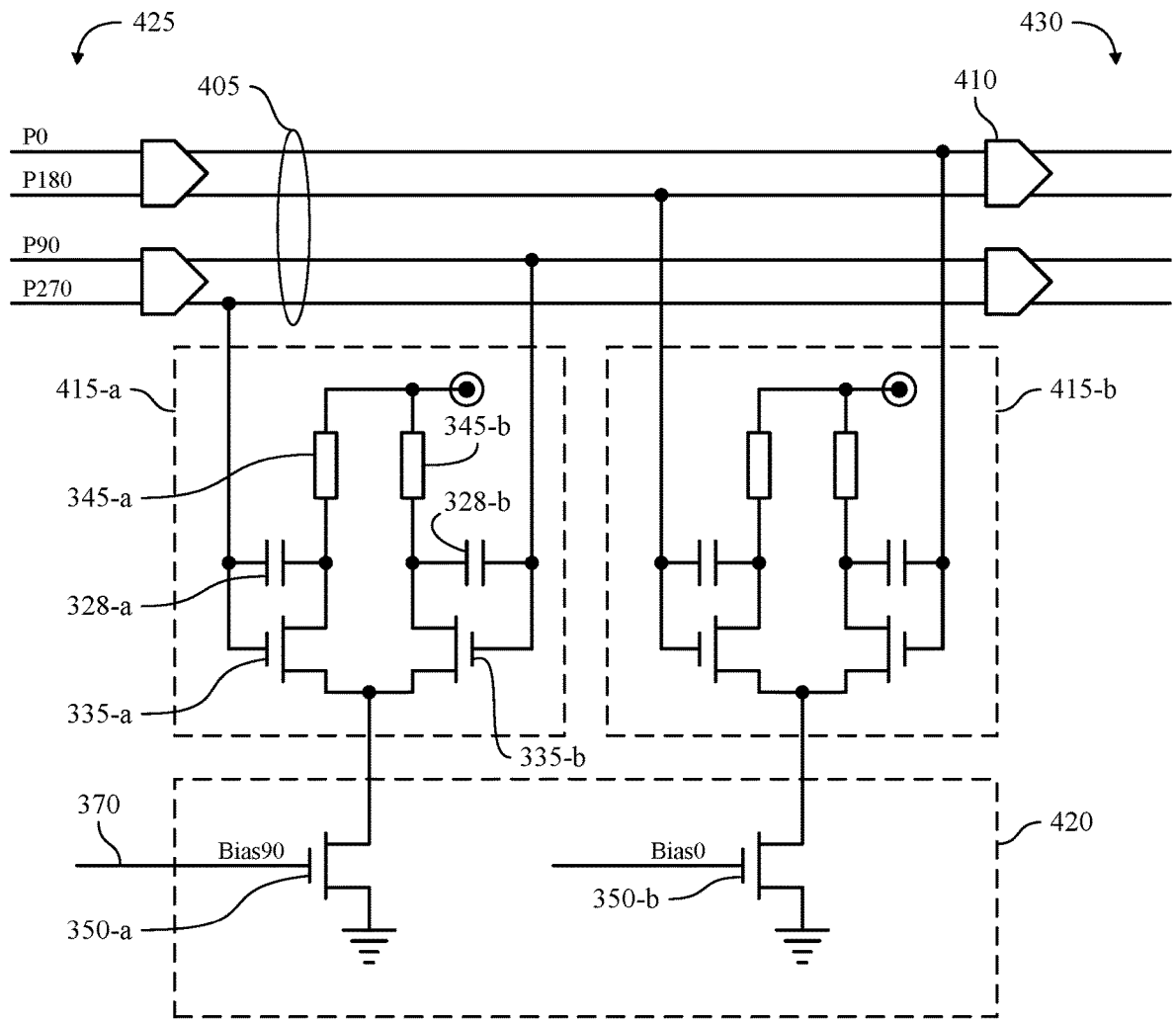
FIGS. 4A-4C illustrate examples of a circuit and associated timing diagram that support delay adjustment circuits in accordance with examples as disclosed herein.
Figure 4B:
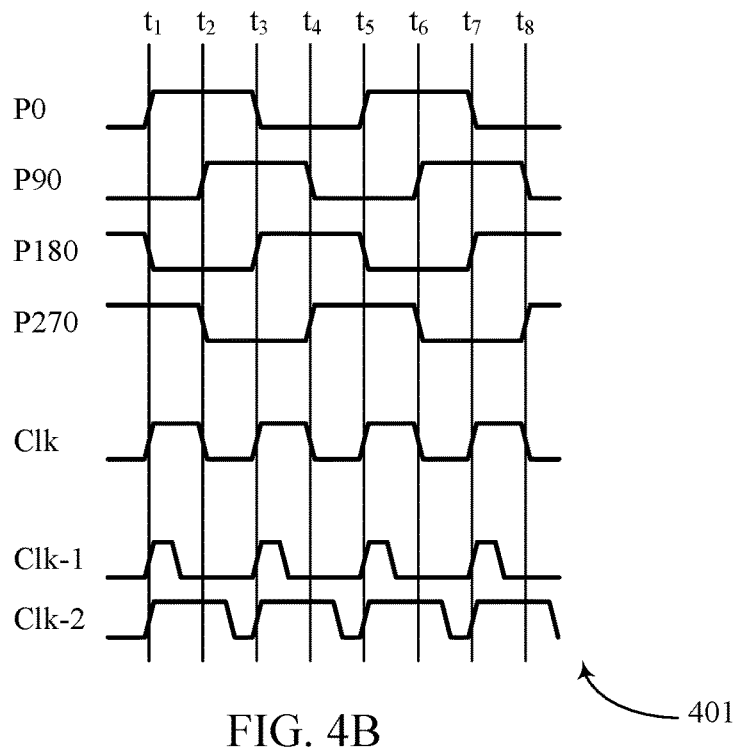
Figure 4C:
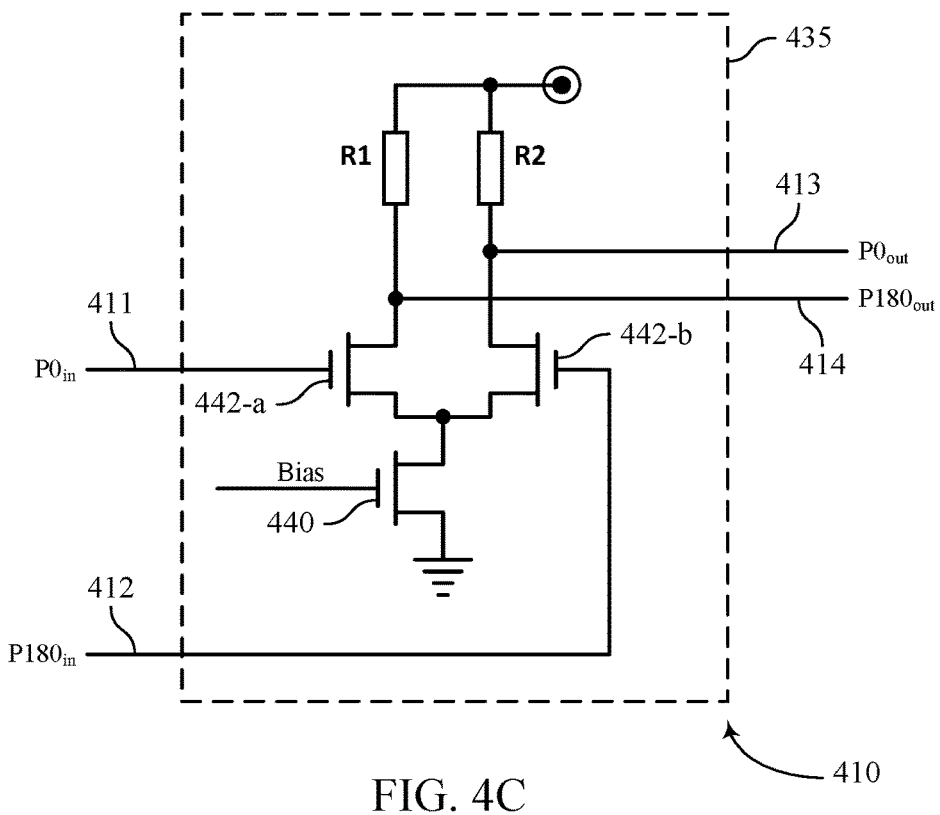

FIGS. 4A-4C illustrate examples of a circuit 400 and associated timing diagram 401 that support delay adjustment circuits in accordance with examples as disclosed herein. Circuit 400 may be utilized to provide a load on a set of signal lines 405 and thereby cause a delay of one or more signals (e.g., multi-phase clock signals) with respect to each other as the signals pass through buffers 410. In some examples, the circuit 400 may be included on a memory die (e.g., memory die 160 as described with reference to FIG. 1). In other examples, all or a portion of the circuit 400 may be positioned off the memory die. The circuit 400 may include a set of amplifiers 415 (e.g., amplifiers 415-a and 415-b) and a sub-circuit 420.

In some examples, the signals may represent multi-phase clock signals. For example, the set of signal lines 405 may be configured to distribute signals of a multi-phase clock (e.g., a four-phase clock). In some examples, the signal lines 405 may distribute signals (e.g., P0, P180, P270, and P280) representing phases 0, 90, 180, and 270 of a four-phase clock, respectively.

FIG. 4B depicts the timing of phased signals (P0, P90, P180, and P270) of a four-phase clock as well as a clock signal (Clk) that may be derivable therefrom. In an ideal four-phase clock, each of the phased signals (P0, P90, P180, and P270) may be ninety degrees out of phase with a preceding phased signal. For example, P270 may be 90 degrees out of phase with P180, which may be 90 degrees out of phase with P90, which may be 90 degrees out of phase with P0, which may be 90 degrees out of phase with P270, as shown. The clock signal (Clk) may be derived by triggering a transition (e.g., moving from a low level to a high level or vice versa) when a rising edge is detected on any of the phased signals. For example, at time t1, Clk may transition to a high level based on the rising edge of P0; and at time t2, Clk may transition to a low level based on the rising edge of P90. This up and down transitioning of Clk may continue in like manner as the rising edges of P180 and P270 are encountered at t3 and t4, respectively. This process may repeat itself each time the rising edges of P0, P90, P180, and P270 are again encountered (e.g., at times t5, t6, t7, and t8).

One benefit to this approach is that a clock signal having a roughly 50% duty cycle may be derived that may have a clock rate that is twice as fast as the rates associated with any of the phased signals. One potential issue, however, is that one or more of the phased signals may become out of phase with respect to the other signals. For example, if P0 and P180 are not 90 degrees out of phase with respect to phased signals P90 and P270, the derived clock signal may be skewed (e.g., not have a 50% duty cycle), resulting in a signal such as clock signal Clk-1 or Clk-2 shown in FIG. 4C. Circuit 400 may be utilized to mitigate this problem.

Returning to FIG. 4A, the set of signal lines 405 may extend from a first end 425 to a second end 430. A set of buffers 410 (e.g., redrivers) may be coupled with the set of signal lines 405 to boost the signals as they propagate from the first end 425 to the second end 430. Each buffer 410 may be coupled with more than one signal line.

As shown in FIG. 4C, each buffer 410 may comprise a differential amplifier 435 having two inputs 411 and 412 and two outputs 413 and 414. The inputs and outputs may be coupled with signal lines 405 between the first and second ends 425 and 430. In some examples, the inputs and outputs of each differential amplifier 435 may correspond to phases that are inverted with respect to one another. For example, the inputs 411 and 412 may be coupled with the $P0_{in}$ and $P180_{in}$ signal lines and the outputs 413 and 414 may be coupled with the associated $P0_{out}$ and $P180_{out}$ signal lines. A bias applied to the differential amplifier 435 may apply a constant current source to the differential amplifier 435. The signals in inputs 411 and 412 may travel over signal traces from a source and may thus have degraded slew rates, while differential amplifier 435 may output differential signals on outputs 413 and 414 that are buffered and have higher slew rates than the inputs 411 and 412.

The buffer 410 may employ current mode logic (CML) in which current from a current generator (e.g., a transistor 440) may be steered between two alternate paths depending on whether a logic zero or logic one is represented. In some examples, the generator may be connected to the two sources of a pair of differential FETs (e.g., transistors 442-a and 442-b) with the two paths being their two drains (e.g., the outputs 413 and 414).

As discussed with reference to FIG. 3A, separate circuits (e.g., separate circuits 300) may be coupled with respective signal lines (e.g., signal lines 405) and the respective biases of the circuits may be used to control the delays of the respective signals. In some examples, the control lines 370 of two or more circuits may be coupled together to provide a same bias to the respective circuits. In some examples, instead of or in conjunction with coupling the control lines together, a single current source may provide current for more than one transistor. This may also allow a single bias to be used to control the delay of signals on more than one signal line.

In some examples, the amplifiers 415 may be formed of a pair of amplifiers (e.g., amplifiers 315) that are configured to couple with different signal lines. For example, each amplifier 415 may include a pair of transistors 335-a and 335-b that are coupled with respective signal lines 405. Similar to amplifiers 315 discussed with reference to FIG. 3A, transistors 335-a and 335-b may be coupled to a voltage source through respective loads 345-a and 345-b (e.g., resistors) and may include respective capacitances 328-a and 328-b between the output nodes and the inputs of the transistors. In some examples, transistors 335-a and 335-b may be coupled together in a differential arrangement (e.g., by coupling the source nodes of the transistors together). In those cases, amplifier 415 may be a differential amplifier. Similar to sub-circuit 320, sub-circuit 420 may include a transistor 350 configured to provide current to the amplifier 415. The transistor 350 may be coupled with both transistors 335-a and 335-b to provide current thereto. In this arrangement, the bias applied to transistor 350 via control line 370 may control the amount of current provided to both transistors 335-a and 335-b simultaneously, which may control the delay of the signals associated therewith. In some examples, the amplifier 415 may be coupled with signal lines having signals that may be inverted from each other (e.g., amplifier 415-a may be coupled with signals P0 and P180 and amplifier 415-b may be coupled with signals P90 and P270) so the inverted signals may be delayed the same amount by the amplifier.

The sub-circuit 420 may include multiple transistors 350, each associated with a different amplifier 415. For example, sub-circuit 420 may include transistors 350-a and 350-b for providing current to amplifiers 415-a and 415-b, respectively. The biases (e.g., Bias0 and Bias90) of the transistors 350 may be individually manipulated to adjust the delays of the signal pairs (e.g., signals P0/P180 and P90/P270) with respect to each other. That way, for example, if phased signals 90 and 270 are out of phase with respect to phased signals 0 and 180, they may be brought back into phase by adjusting one of the biases. In some cases, the signals may be measured and the biases set accordingly when the memory device is manufactured. In some cases, the signals may be monitored periodically during use and the biases set accordingly. Monitoring the signals and/or manipulating the biases may be done by a controller (e.g., device memory controller 155 or local memory controller 165), manually, or in any other manner.

Figure 5:
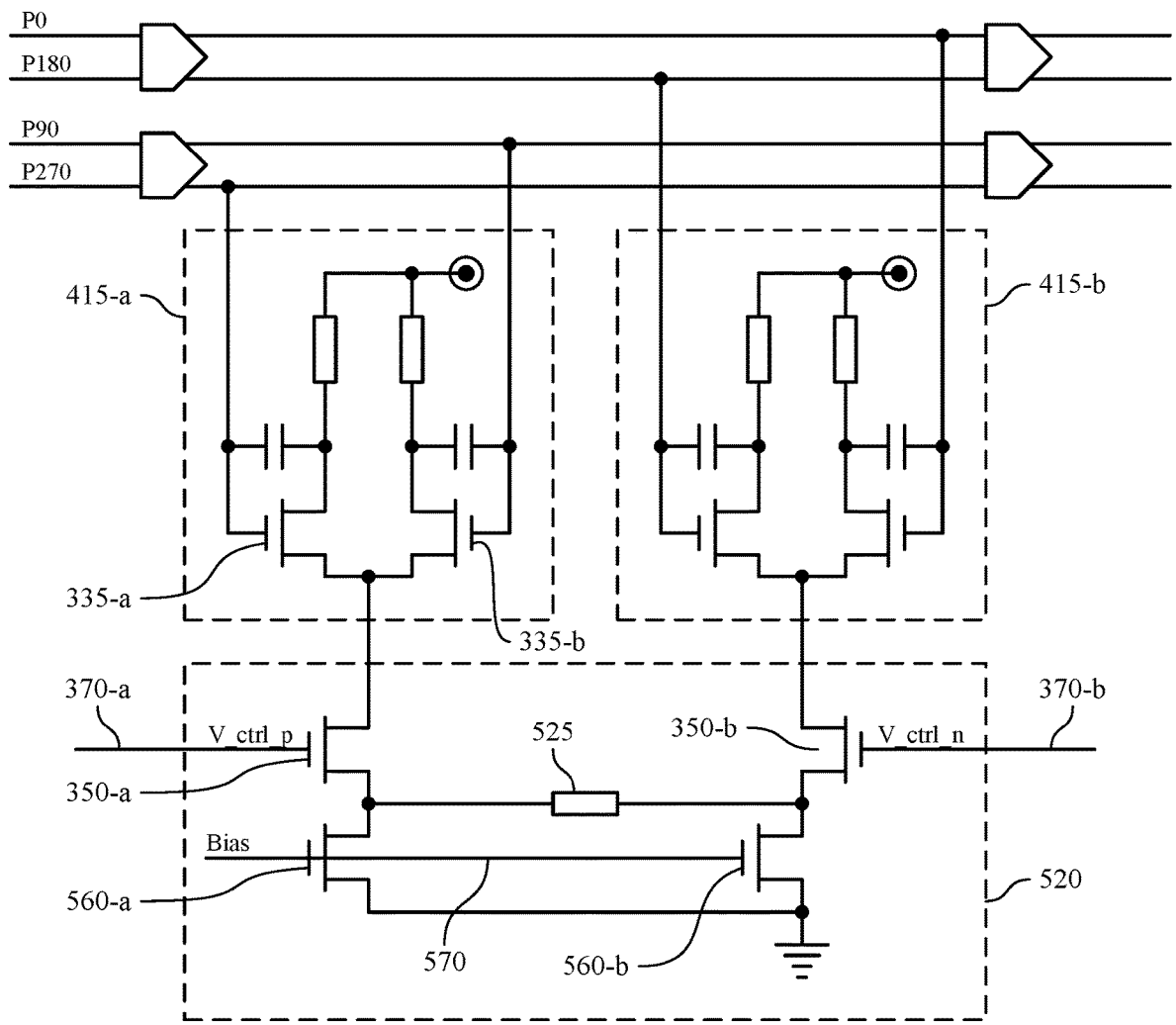
FIG. 5 illustrates an example of a circuit that supports delay adjustment circuits in accordance with examples as disclosed herein.

FIG. 5 illustrates an example of a circuit 500 that supports delay adjustment circuits in accordance with examples as disclosed herein. Circuit 500 is similar to circuit 400, except that in circuit 500, the differential circuits 415 may themselves be differentially controlled by the sub-circuit 520. In some examples, the two transistors 350-a and 350-b may be coupled together in a differential arrangement (e.g., by coupling the source nodes of the transistors together). The differential circuit may be controlled by differential signals (e.g., V_ctrl_p and V_ctrl_n) on the control lines 370-a and 370-b of the transistors 350-a and 350-b. One benefit to such an approach is that the currents that the sub-circuit 520 may provide to the amplifiers 415 may be sensitive mostly to the difference between the control voltages (e.g., V_ctrl_p and V_ctrl_n), and not to the absolute values thereof.

In some examples, a resistance 525 and a second set of transistors 560-a and 560-b may be coupled between the transistors 350-a and 350-b in a second differential arrangement. In some examples, the control lines 570 of the second set of transistors 560-a and 560-b may be tied together. The resistance 525 may determine the sensitivity of the second set of transistors 560-a and 560-b to the control voltages (e.g., V_ctrl_p and V_ctrl_n) of the transistors 350-a and 350-b. If the resistance 525 is at or near 0 Ω (e.g., a closed circuit), the sensitivity may be at a high level and the sub-circuit may act as a classic differential amplifier. If the resistance 525 is at a large value (e.g., an open-circuit), the control voltages (e.g., V_ctrl_p and V_ctrl_n) of the transistors 350-a and 350-b may have little or no influence on the tail currents provided to the amplifiers 415.

Using a differential signal to control the amplifiers may result in a better power-supply suppression ratio and a common-mode noise rejection for the control voltages. However, if one of the control voltages (v_ctrl_p for example) is close to zero, a parasitic signal path between the inputs of the differential amplifier 415 (e.g., between the gates of the transistors 335-a and 335-b) may remain and the equivalent input capacitance (even without taking into account the Miller-capacitance) may be relatively large. As a result, this circuit may be used in a relatively narrow range of delay regulation.

Figure 6:
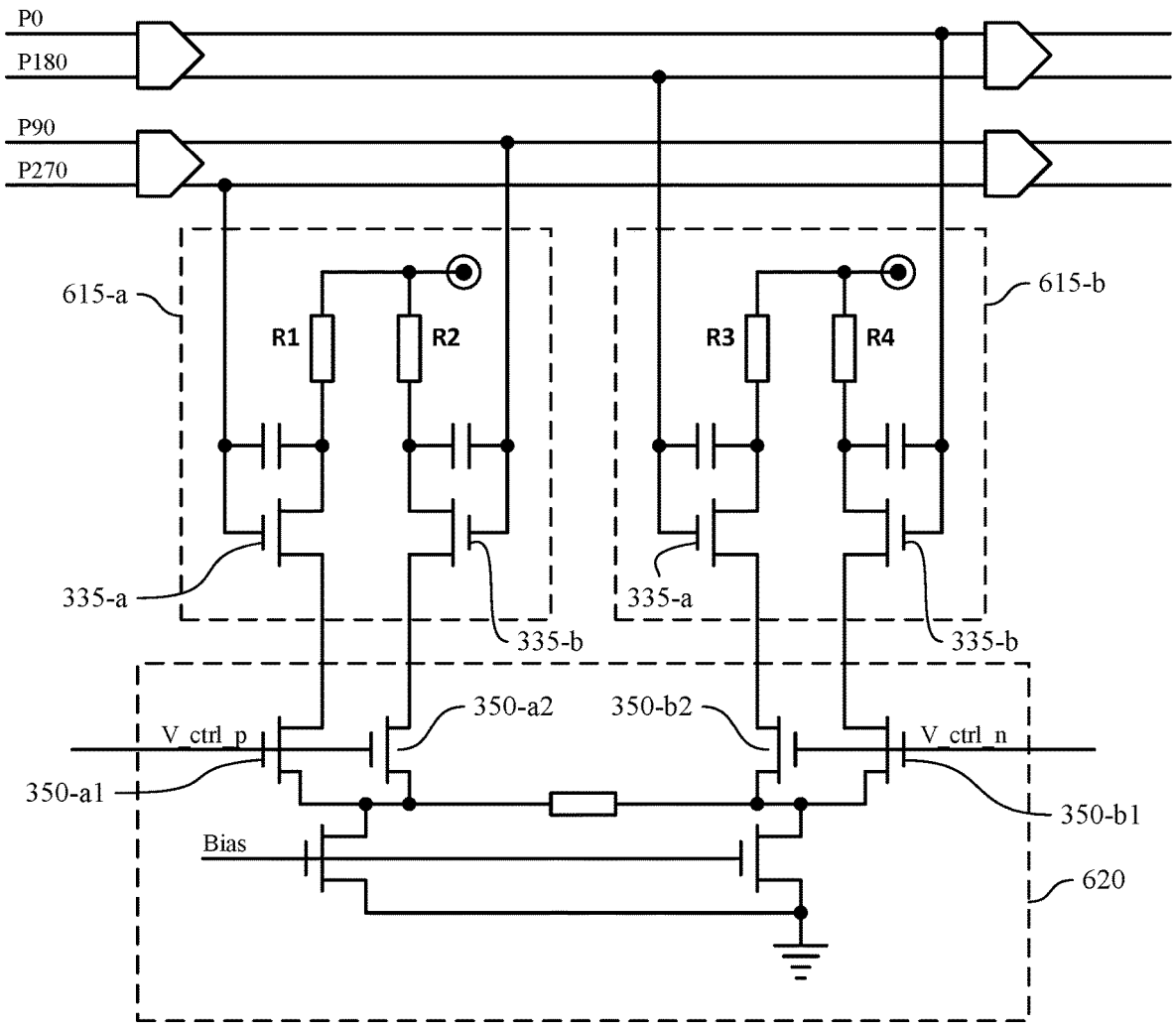
FIG. 6 illustrates an example of a circuit that supports delay adjustment circuits in accordance with examples as disclosed herein.

FIG. 6 illustrates an example of a circuit that supports delay adjustment circuits in accordance with examples as disclosed herein. Circuit 600 may be configured to provide separate currents to each of the transistors of the amplifiers. This may remedy some of the issues discussed with reference to circuit 500. Circuit 600 may be similar to circuit 500, except that in each amplifier 615, the coupling between the transistors 335-a and 335-b may be removed and the transistors 350-a and 350-b of the sub-circuit 620 may each be divided into (e.g., replaced by) two separate transistors that provide separate current to each transistor 335-a and 335-b. For example, transistor 350-a may be replaced by transistors 350-a1 and 350-a2, which may be separately coupled with transistors 335-a and 335-b, respectively, of the first amplifier 615-a. And transistor 350-b may be replaced by transistors 350-b1 and 350-b2, which may be separately coupled with transistors 335-a and 335-b of amplifier 615-b, respectively, of the second amplifier 615-b.

These changes may effectively isolate the transistors 335 of each amplifier 615 from each other, removing the parasitic paths between the inputs of the differential amplifier (e.g., between the gates of the transistors 335-a and 335-b). As a result, the capacitance of the amplifier 615 due to the Miller effect may dominate, even if one of the control voltages (e.g., V_ctrl_p and V_ctrl_n) may be close to zero. As a result, circuit 600 may be used in a wider range of delay regulation. In some examples, a delay trimming range of +/−10 psec may be achieved by a single stage of circuit 600. Additional delay trimming may be added in following stages.

Figure 7A:
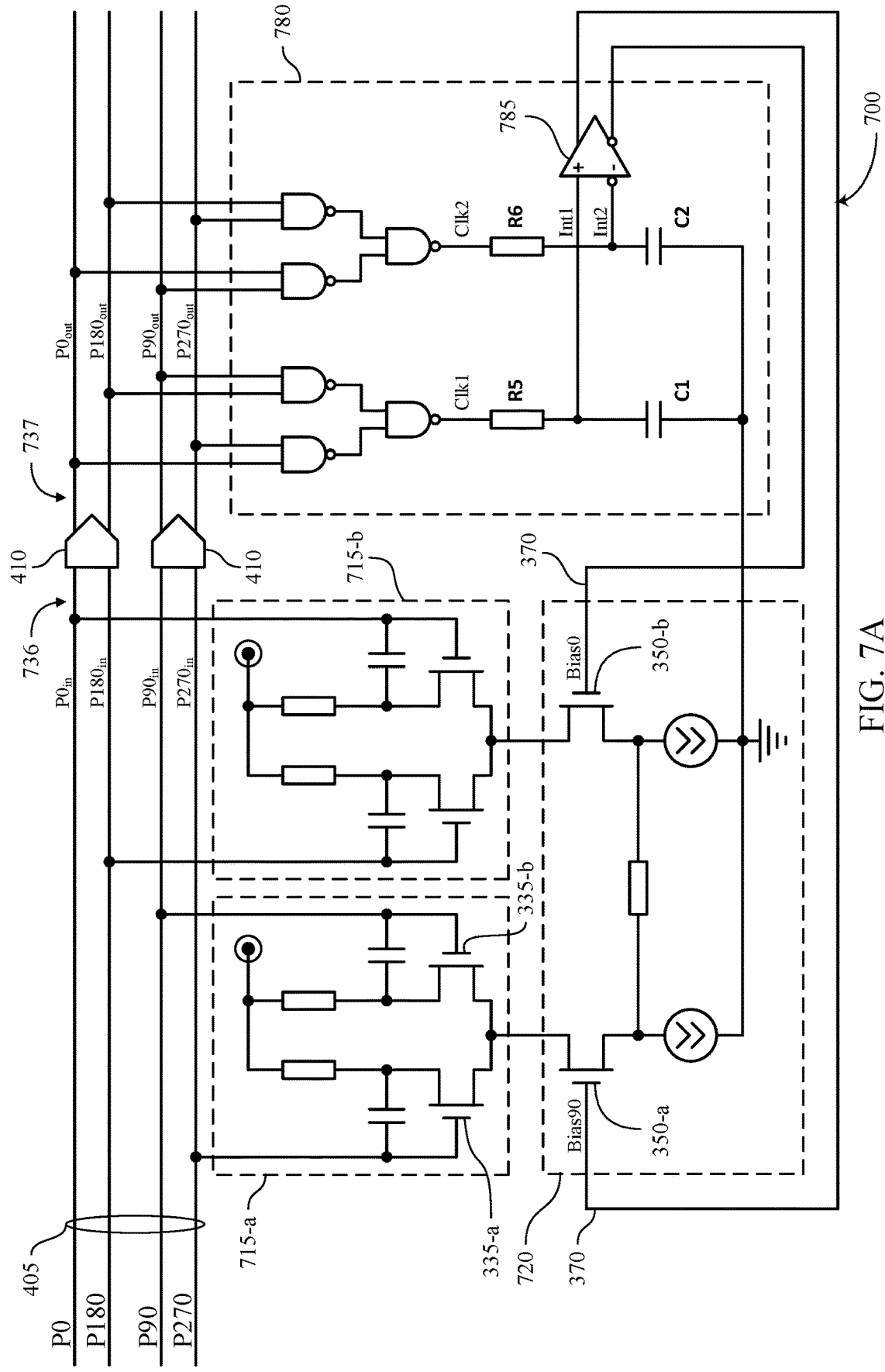
FIGS. 7A-7C illustrate an example of a circuit and associated timing diagram that support delay adjustment circuits in accordance with examples as disclosed herein.
Figure 7B:
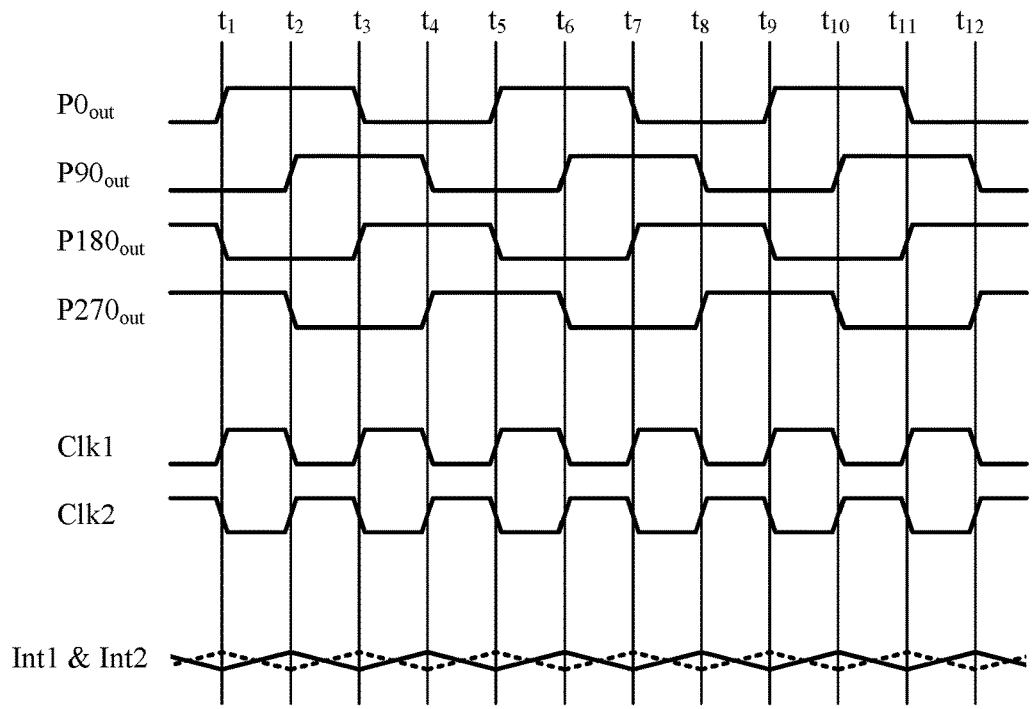
Figure 7C:
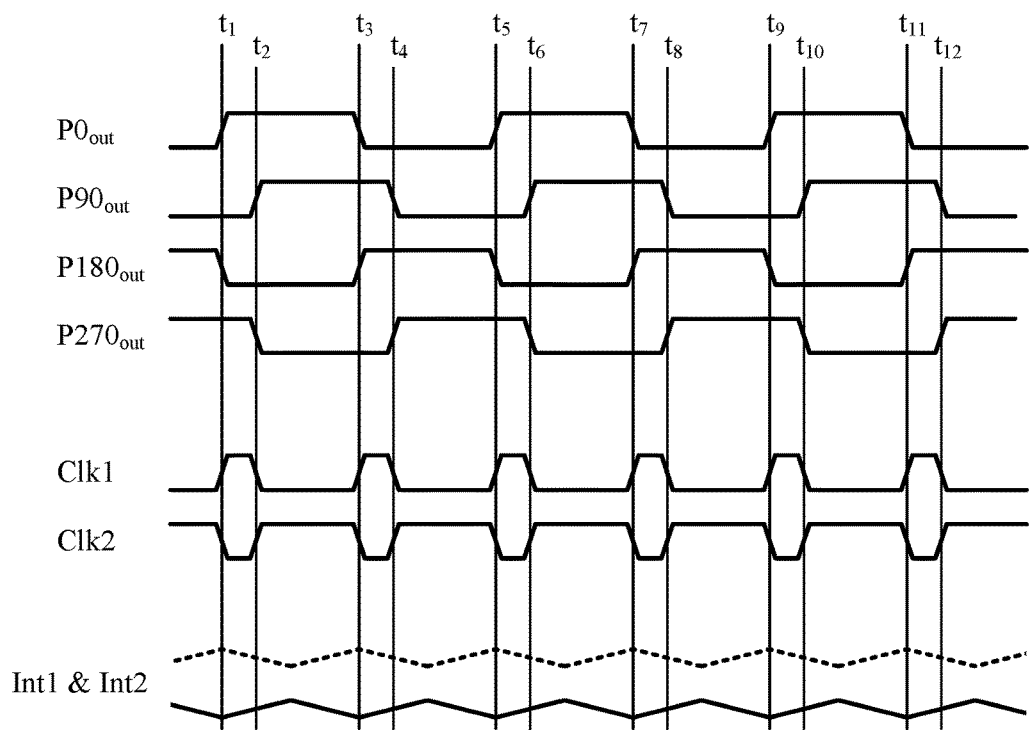

FIGS. 7A-7C illustrate an example of a circuit 700 and associated timing diagrams that support delay adjustment circuits in accordance with examples as disclosed herein. Circuit 700 may implement aspects of the system as described with reference to FIGS. 1-6. For example, circuit 700 may include a set of amplifiers 715 and a sub-circuit 720 that may be similar to or comprise any of the amplifiers and sub-circuits discussed herein. Circuit 700 may further include a second circuit 780.

In some examples, feedback may be used to provide correction to (e.g., align) delay that has been added to the signals. For example, an amount of delay caused to occur on multi-phase clock signals may be used to help correct an amount of delay to continue to add to the signals (e.g., in a locked-loop type of configuration). Second circuit 780 may provide such feedback. The second circuit 780 may control the biases (e.g., Bias0 and Bias90) of the sub-circuit 720 based on the delays that the amplifiers 715 cause to occur on the signals.

The amplifiers 715 may couple with a set of signal lines 405 associated with a set of signals (e.g., four-phase clock signals P0, P180, P90, and P270) on an input side 736 of a set of buffers 410. The load caused by the amplifiers 715 on the signal lines 405 may cause a delay to occur on one or more of the signals with respect to the rest of the signals as they propagate through a set of buffers 410, as discussed herein. That is, delays may become present on one set of inverted signals (e.g., signals $P0_{out}/P180_{out}$ or $P90_{out}/P270_{out}$) on an output side 737 of the buffers 410 with respect to the set of inverted signals (e.g., signals $P0_{in}/P180_{in}$ or $P90_{in}/P270_{in}$) on the input side 736 of the buffers 410.

The feedback circuit 780 may couple with the set of signal lines 405 on the output side 737 of the buffers 410 to obtain the set of delayed signals (e.g., signals $P0_{out}$, $P180_{out}$, $P90_{out}$, and $P270_{out}$). The feedback circuit 780 may include circuitry that may derive a clock signal based on the delayed signals. In the example of FIG. 7A, the circuitry may include a plurality of NAND gates coupled with different combinations of the signal lines 405 on the output side 737 of the buffers 410 and with each other to generate signals Clk1 and Clk2 representing a derived clock signal and its inversion, based on the delayed four-phase clock signals. FIG. 7B depicts an example of the clock signals Clk1 and Clk2 that may be obtained when the signals $P0_{out}$, $P180_{out}$, $P90_{out}$, and $P270_{out}$ correspond to the depicted ideal four-phase clock signals. The derived clock signals Clk1 and Clk2 may be used to determine or adjust the biases (e.g., Bias0 and Bias90) of the sub-circuit 720.

In some examples, the derived clock signals Clk1 and Clk2 may each be subjected to an RC circuit to obtain an integration signal for each. For example, the derived clock signal Clk1 may be subjected to an RC circuit that includes a capacitance C1 and a resistance R5 to obtain a first integration signal Int1 and the derived clock signal Clk2 may be subjected to an RC circuit that includes a capacitance C2 and a resistance R6 to obtain a second integration signal Int2. The integration signals Int1 and Int2 may reflect the duty cycles of the clock signals Clk1 and Clk2. For an ideal clock, such as shown in FIG. 7B, the duty cycles of both signals Clk1 and Clk2 may be at generally 50%. When this is the case, the integration signals Int1 and Int2 may be at roughly the same levels, as depicted in FIG. 7B.

If the duty cycles of both signals Clk1 and Clk2 are not the same as each other, one of the set of inverted signals of the four-phase signals may be out of sync with respect to the set of inverted signals. For example, FIG. 7C depicts an example of the clock signals Clk1 and Clk2 that may be obtained when the inverted signals $P0_{out}/P180_{out}$ are not in sync with the inverted signals $P90_{out}/P270_{out}$. As shown, the phased inverted signals $P90_{out}$ and $P270_{out}$ are shifted with respect to the phased inverted signals $P0_{out}$ and $P180_{out}$ so that the duty cycles of the derived clock signals Clk1 and Clk2 are significantly different from each other. This may result in the integration signals Int1 and Int2 being at different levels from each other, as depicted in FIG. 7C.

The integration signals Int1 and Int2 may be used to determine the amount of bias to apply to the transistors 350 of the sub-circuit 720. In some examples, the integration signals Int1 and Int2 may be or provide the bias signals (e.g., Bias0 and Bias90). For example, the integration signals Int1 and Int2 may be input to an operational amplifier 785 and the outputs of the operational amplifier 785 may be coupled with the control lines 370 of the transistors 350. If the clock is at or near a 50% duty cycle, the biases applied to the transistors 350 associated with the sets of inverted signals (e.g., signals P0/P180 and P90/P270) may be generally the same so that the sets of inverted signals may not be delayed with respect to each other. But if the clock is not at or near a 50% duty cycle, the bias applied to one transistor 350 may be higher than the bias applied to the other transistor 350 so that the associated inverted signal set (e.g., inverted signal set P0/P180 or P90/P270) may be delayed with respect to the other inverted signal set to bring the clock's duty cycle back to around 50%.

In some examples, a controller (e.g., a device memory controller 155 or a local memory controller 165) may be used instead of or in conjunction with an operational amplifier 785: the integration signals Int1 and Int2 may be input to the controller, the controller may determine an amount of delay to add to one or more of the signals, and an output of the controller may control the inputs of the control lines 370 of the transistors 350 via control circuitry.

Figure 8:
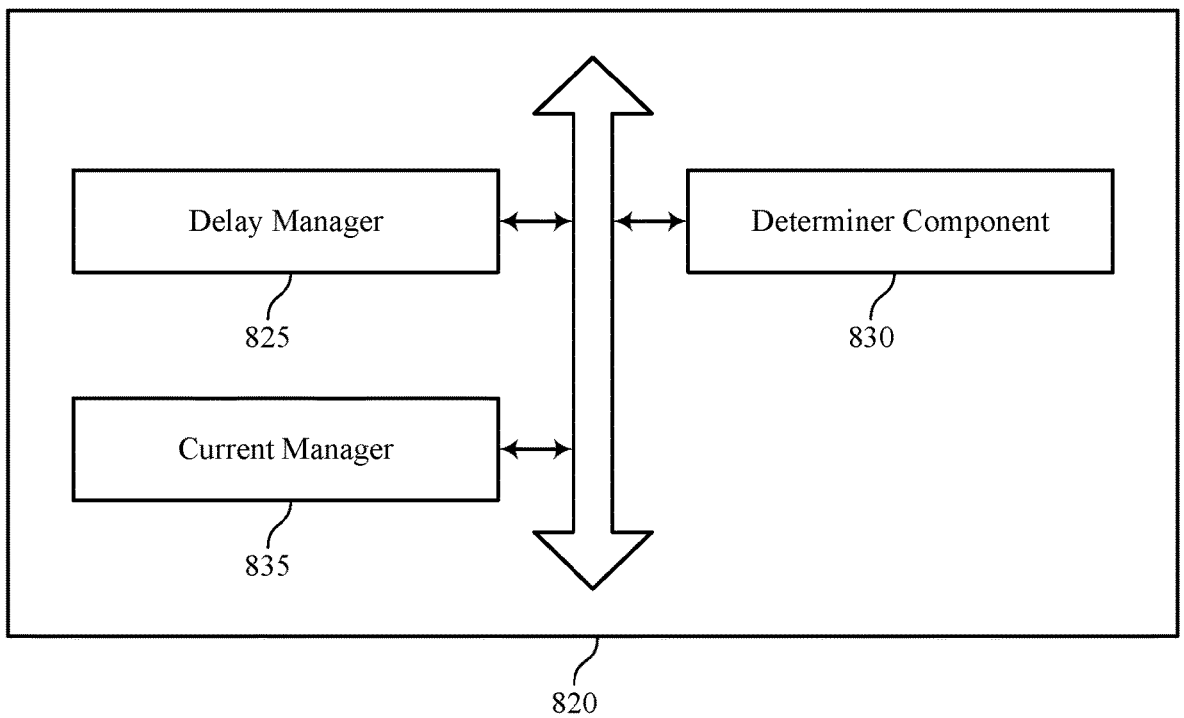
FIG. 8 shows a block diagram of a memory device that supports delay adjustment circuits in accordance with examples as disclosed herein.

FIG. 8 shows a block diagram 800 of a memory device 820 that supports delay adjustment circuits in accordance with examples as disclosed herein. The memory device 820 may be an example of aspects of a memory device as described with reference to FIGS. 1 through 7C. The memory device 820, or various components thereof, may be an example of means for performing various aspects of delay adjustment circuits as described herein. For example, the memory device 820 may include a delay manager 825, determiner component 830, a current manager 835, or any combination thereof. Each of these components may communicate, directly or indirectly, with one another (e.g., via one or more buses).

The delay manager 825 may be configured as or otherwise support a means for establishing a delay of a signal on a signal line coupled with an input of an amplifier by setting a gain of the amplifier between a node of the amplifier and the input, the amplifier having an impedance between the input and the node. The determiner component 830 may be configured as or otherwise support a means for determining to change the delay of the signal on the signal line. The delay manager 825 may be configured as or otherwise support a means for adjusting the delay of the signal on the signal line by changing the gain of the amplifier.

In some examples, to support changing the gain of the amplifier, the current manager 835 may be configured as or otherwise support a means for adjusting a current provided to the amplifier.

In some examples, the delay manager 825 may be configured as or otherwise support a means for establishing a second delay of a second signal on a second signal line coupled with a second input of a second amplifier, in conjunction with establishing the delay of the signal on the second signal line, by setting a second gain of the second amplifier at a second node of the second amplifier relative to the second input, the second amplifier having a second impedance between the second input and the second node. In some examples, the delay manager 825 may be configured as or otherwise support a means for adjusting the second delay of the second signal on the second signal line, in conjunction with adjusting the delay of the signal on the signal line, by changing the second gain of the second amplifier.

In some examples, to support changing the gain of the amplifier, the current manager 835 may be configured as or otherwise support a means for adjusting a current provided to the amplifier. In some examples, to support changing the second gain of the second amplifier, the current manager 835 may be configured as or otherwise support a means for adjusting a second current provided to the second amplifier.

In some examples, to support adjusting the current provided to the amplifier and adjusting the second current provided to the second amplifier, the current manager 835 may be configured as or otherwise support a means for adjusting a bias voltage of a third input of a transistor coupled with the amplifier and the second amplifier.

Figure 9:
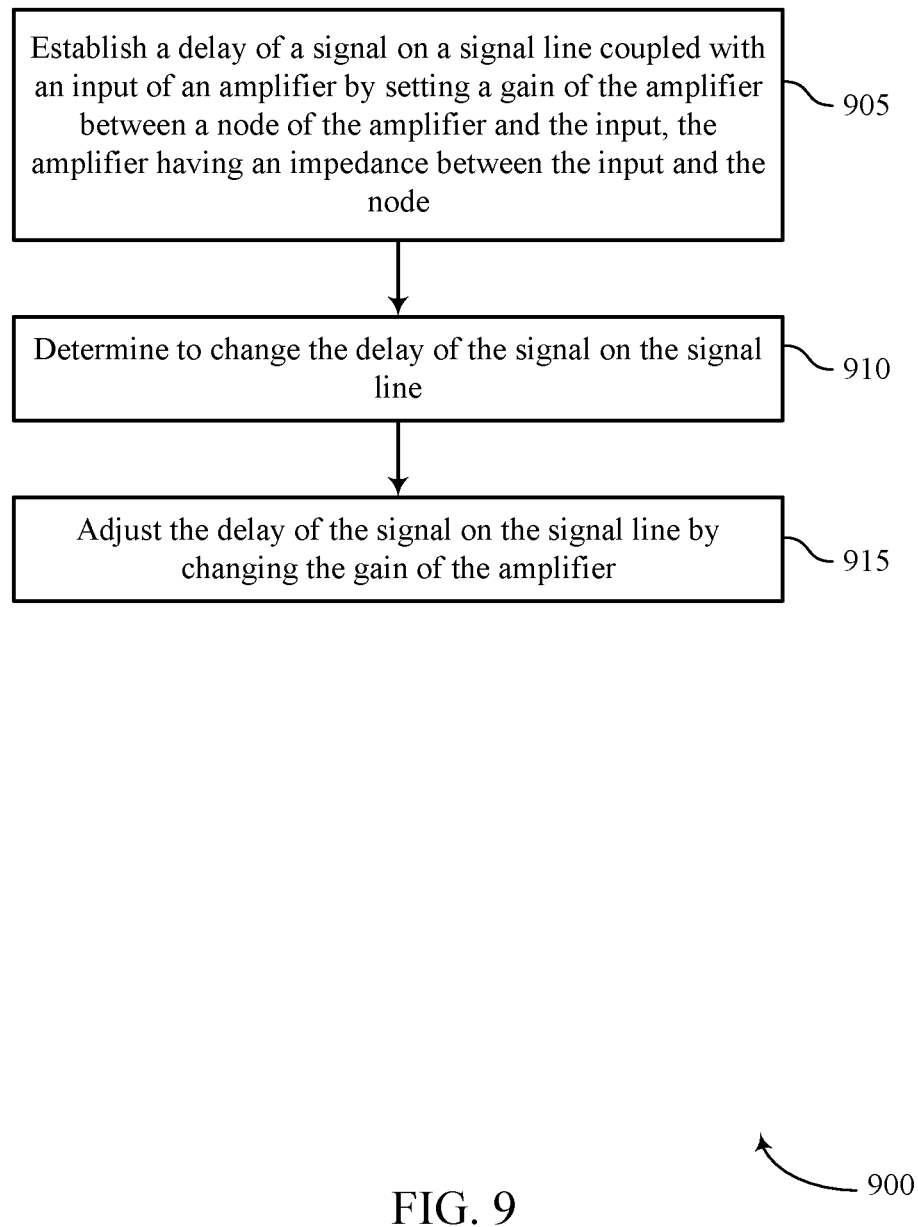
FIG. 9 shows a flowchart illustrating a method that supports delay adjustment circuits in accordance with examples as disclosed herein.

FIG. 9 shows a flowchart illustrating a method 900 that supports delay adjustment circuits in accordance with examples as disclosed herein. The operations of method 900 may be implemented by a memory device or its components as described herein. For example, the operations of method 900 may be performed by a memory device as described with reference to FIGS. 1 through 8. In some examples, a memory device may execute a set of instructions to control the functional elements of the device to perform the described functions. Additionally or alternatively, the memory device may perform aspects of the described functions using special-purpose hardware.

At 905, the method may include establishing a delay of a signal on a signal line coupled with an input of an amplifier by setting a gain of the amplifier between a node of the amplifier and the input, the amplifier having an impedance between the input and the node. The operations of 905 may be performed in accordance with examples as disclosed herein. In some examples, aspects of the operations of 905 may be performed by a delay manager 825 as described with reference to FIG. 8.

At 910, the method may include determining to change the delay of the signal on the signal line. The operations of 910 may be performed in accordance with examples as disclosed herein. In some examples, aspects of the operations of 910 may be performed by a determiner component 830 as described with reference to FIG. 8.

At 915, the method may include adjusting the delay of the signal on the signal line by changing the gain of the amplifier. The operations of 915 may be performed in accordance with examples as disclosed herein. In some examples, aspects of the operations of 915 may be performed by a current manager 835 as described with reference to FIG. 8.

In some examples, an apparatus as described herein may perform a method or methods, such as the method 900. The apparatus may include, features, circuitry, logic, means, or instructions (e.g., a non-transitory computer-readable medium storing instructions executable by a processor) for establishing a delay of a signal on a signal line coupled with an input of an amplifier by setting a gain of the amplifier between a node of the amplifier and the input, the amplifier having an impedance between the input and the node, determining to change the delay of the signal on the signal line, and adjusting the delay of the signal on the signal line by changing the gain of the amplifier.

In some examples of the method 900 and the apparatus described herein, changing the gain of the amplifier may include operations, features, circuitry, logic, means, or instructions for adjusting a current provided to the amplifier.

Some examples of the method 900 and the apparatus described herein may further include operations, features, circuitry, logic, means, or instructions for establishing a second delay of a second signal on a second signal line coupled with a second input of a second amplifier, in conjunction with establishing the delay of the signal on the second signal line, by setting a second gain of the second amplifier at a second node of the second amplifier relative to the second input, the second amplifier having a second impedance between the second input and the second node, and adjusting the second delay of the second signal on the second signal line, in conjunction with adjusting the delay of the signal on the signal line, by changing the second gain of the second amplifier.

In some examples of the method 900 and the apparatus described herein, changing the gain of the amplifier may include operations, features, circuitry, logic, means, or instructions for adjusting a current provided to the amplifier and changing the second gain of the second amplifier may include operations, features, circuitry, logic, means, or instructions for adjusting a second current provided to the second amplifier.

In some examples of the method 900 and the apparatus described herein, adjusting the current provided to the amplifier and adjusting the second current provided to the second amplifier may include operations, features, circuitry, logic, means, or instructions for adjusting a bias voltage of a third input of a transistor coupled with the amplifier and the second amplifier.

It should be noted that the methods described herein describe possible implementations, and that the operations and the steps may be rearranged or otherwise modified and that other implementations are possible. Further, portions from two or more of the methods may be combined.

An apparatus is described. The apparatus may include a signal line and a circuit configured to provide a load on the signal line. The circuit may include an amplifier having an input coupled with the signal line, the amplifier having an impedance between the input and a node of the amplifier, the amplifier having a gain at the node relative to the input; and a sub-circuit coupled with the amplifier and configured to control the gain of the amplifier.

In some examples of the apparatus, the impedance may include an intrinsic capacitance of an input device of the amplifier. In some examples of the apparatus, the input device may include a transistor.

In some examples of the apparatus, the impedance may include a capacitor coupled between the input and the node of the amplifier.

In some examples of the apparatus, the sub-circuit may include a transistor configured to provide a current to the amplifier to control the gain of the amplifier. In some examples of the apparatus, the transistor may include a second input configured to receive a bias to control the current provided by the transistor to the amplifier.

In some examples of the apparatus, the circuit may be configured to delay a signal on the signal line based on the gain of the amplifier.

An apparatus is described. The apparatus may include a set of signal lines extending from a first end to a second end, the set of signal lines configured to distribute signals of a multi-phase clock and a circuit coupled with the set of signal lines, the circuit configured to provide a load on the set of signal lines. The circuit may include a set of amplifiers having a set of inputs coupled with the set of signal lines, the set of amplifiers having respective gains at nodes of the set of amplifiers relative to respective inputs of the set of inputs; and a sub-circuit coupled with the set of amplifiers, the sub-circuit configured to control the respective gains of the set of amplifiers.

In some examples, the apparatus may include a set of buffers coupled with the set of signal lines between the first and second ends, the set of buffers configured to buffer the signals of the multi-phase clock, the circuit coupled with the set of signal lines between the first end and the set of buffers; and a second circuit having a second set of inputs coupled with the set of signal lines between the set of buffers and the second end, the second circuit coupled with the sub-circuit and configured to control the sub-circuit based on signals detected on the second set of inputs. In some examples of the apparatus, the second circuit may be configured to control bias currents of the sub-circuit based on an amount of overlap of signal values corresponding to different phases of the multi-phase clock.

In some examples of the apparatus, the sub-circuit may include respective transistors coupled with the set of amplifiers, the respective transistors configured to provide respective currents to the set of amplifiers to control respective gains of the set of amplifiers. In some examples of the apparatus, each of the set of amplifiers may include a first transistor having a first gate coupled to a first input of the set of inputs and a second transistor having a second gate coupled to a second input of the set of inputs, and wherein the respective transistor associated with the each of the set of amplifiers may include a third transistor coupled in series with the first transistor and a fourth transistor coupled in series with the second transistor.

In some examples of the apparatus, the circuit may include a set of differential stages, each differential stage including a respective plurality of amplifiers of the set of amplifiers. In some examples of the apparatus, the sub-circuit may include a set of tail-current sources coupled with the set of differential stages. In some examples of the apparatus, the sub-circuit may be further configured to differentially control current provided to a respective plurality of amplifiers of a differential stage of the set of differential stages.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent FET and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
   a set of signal lines; and
   a circuit configured to provide a load on the set of signal lines associated with a set of signals of a multi-phase clock, the circuit comprising:
   a set of amplifiers each having a respective input coupled with a corresponding signal line of the set of signal lines, the set of amplifiers having respective gains at nodes of the set of amplifiers relative to the respective inputs;
   a sub-circuit coupled with the set of amplifiers and configured to control the respective gains of the set of amplifiers; and
   a second circuit having a set of inputs coupled with the set of signal lines, the second circuit coupled with the sub-circuit and configured to control the sub-circuit based on signals detected on the set of inputs.

2. The apparatus of claim 1, wherein to control the sub-circuit, the second circuit is configured to adjust a first bias current and a second bias current of the sub-circuit based at least in part on a set of delays caused by the load on the set of signals.

3. The apparatus of claim 2, wherein the sub-circuit is configured to control the respective gains of the set of amplifiers based at least in part on the adjusted first bias current and the adjusted second bias current.

4. The apparatus of claim 3, further comprising:
   a set of buffers coupled with the set of signal lines between a first end and a second end, the set of buffers configured to buffer the signals of the multi-phase clock, the circuit coupled with the set of signal lines between the first end and the set of buffers, wherein the set of inputs of the second circuit are coupled with the set of signal lines between the set of buffers and the second end.

5. The apparatus of claim 4, wherein the circuit is configured to delay the set of signals on the set of signal lines based on the respective gains of the set of amplifiers.

6. The apparatus of claim 5, wherein the set of signals comprises a delayed first set of inverted signals on an output side of the set of buffers and wherein a delay of the delayed first set of inverted signals is with respect to a second set of inverted signals on an input side of the set of buffers.

7. The apparatus of claim 6, wherein the second circuit is configured to couple the set of signal lines to the output side of the set of buffers to obtain the delayed first set of inverted signals.

8. The apparatus of claim 2, further comprising:
   a set of gates coupled with the set of signal lines, the set of gates configured to generate a set of clock signals, wherein adjusting the first bias current and the second bias current of the sub-circuit is based at least in part on the set of clock signals.

9. The apparatus of claim 1, wherein the sub-circuit comprises a transistor configured to provide a current to the set of amplifiers to control the respective gains of the set of amplifiers.

10. A method comprising:
    coupling a set of signal lines associated with a set of signals to an input side of a set of buffers;
    obtaining a set of delayed signals on the set of signal lines based at least in part on coupling the set of signal lines to the set of buffers;
    deriving a set of clock signals from the set of delayed signals;
    obtaining a first integration signal for a first clock signal of the set of clock signals based at least in part on a first capacitance and a first resistance;
    obtaining a second integration signal for a second clock signal of the set of clock signals based at least in part on a second capacitance and a second resistance;
    inputting the first integration signal to a first input of an amplifier and the second integration signal to a second input of the amplifier; and
    biasing, by an output of the amplifier, a control line of a transistor.

11. The method of claim 10, wherein the set of signal lines are coupled with a set of gates and deriving the set of clock signals comprises:
    generating the set of clock signals by the set of gates based at least in part on the set of delayed signals.

12. The method of claim 10, further comprising:
    obtaining an integration signal for each of the set of clock signals.

13. The method of claim 12, wherein obtaining the integration signal for each of the set of clock signals comprises:
    subjecting the first clock signal of the set of clock signals to a first circuit comprising the first capacitance and the first resistance to obtain the first integration signal; and
    subjecting the second clock signal of the set of clock signals to a second circuit comprising the second capacitance and the second resistance to obtain the second integration signal.

14. The method of claim 13, wherein the first integration signal is associated with a first duty cycle for the set of clock signals and the second integration signal is associated with a second duty cycle for the set of clock signals.

15. The method of claim 14, wherein: the first duty cycle is different from the second duty cycle;
    at least one of the set of signals is out of sync with the set of delayed signals; and
    the first integration signal is associated with a first level and the second integration signal is associated with a second level different form the first level.

16. The method of claim 14, further comprising:
    determining an amount of bias to apply to a set of transistors of a circuit based at least in part on a set of bias signals provided by the first integration signal and the second integration signal.

17. A memory system, comprising:
    one or more memory devices; and
    processing circuitry coupled with the one or more memory devices and configured to cause the memory system to:
    couple a set of signal lines associated with a set of signals to an input side of a set of buffers;
    obtain a set of delayed signals on the set of signal lines based at least in part on coupling the set of signal lines to the set of buffers;
    derive a set of clock signals from the set of delayed signals;
    obtain a first integration signal for a first clock signal of the set of clock signals based at least in part on a first capacitance and a first resistance;
    obtain a second integration signal for a second clock signal of the set of clock signals based at least in part on a second capacitance and a second resistance;
    input the first integration signal to a first input of an amplifier and the second integration signal to a second input of the amplifier; and bias, by an output of the amplifier, a control line of a transistor.

18. The memory system of claim 17, wherein the set of signal lines are coupled with a set of gates and deriving the set of clock signals further comprises the processing circuitry configured to cause the memory system to:
generate the set of clock signals by the set of gates based at least in part on the set of delayed signals.

19. The memory system of claim 17, wherein the processing circuitry is further configured to cause the memory system to:
obtain an integration signal for each of the set of clock signals.

20. The memory system of claim 19, wherein obtaining the integration signal for each of the set of clock signals further comprises the processing circuitry configured to cause the memory system to:
subject the first clock signal of the set of clock signals to a first circuit comprising the first capacitance and the first resistance to obtain the first integration signal; and
subject the second clock signal of the set of clock signals to a second circuit comprising the second capacitance and the second resistance to obtain the second integration signal.

* * * * *